(12) United States Patent
Denisenko et al.

(10) Patent No.: US 9,166,597 B1
(45) Date of Patent: Oct. 20, 2015

(54) INTEGRATED CIRCUIT PROCESSING VIA OFFLOAD PROCESSOR

(71) Applicant: ALTERA CORPORATION, San Jose, CA (US)

(72) Inventors: Dmitry Nikolai Denisenko, Toronto (CA); John Stuart Freeman, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/242,718

(22) Filed: Apr. 1, 2014

(51) Int. Cl.
H03K 19/177 (2006.01)

(52) U.S. Cl.
CPC ................................ H03K 19/17728 (2013.01)

(58) Field of Classification Search
None
See application file for complete search history.

(56) References Cited

U.S. PATENT DOCUMENTS

2014/0181458 A1* 6/2014 Loh et al. ...................... 711/206
2014/0240327 A1* 8/2014 Lustig et al. ................... 345/505
2015/0016172 A1* 1/2015 Loh et al. ......................... 365/51

* cited by examiner

Primary Examiner — Jany Richardson
(74) Attorney, Agent, or Firm — Fletcher Yoder, P.C.

(57) ABSTRACT

Systems and methods for offloading computations of an integrated circuit (IC) to a processor are provided. In particular, a programmable logic designer, compiler, etc. may dictate particular logic to offload to a processor. This offloading may enhance programmable logic area utilization and/or increase throughput.

20 Claims, 5 Drawing Sheets

INTEGRATED CIRCUIT PROCESSING VIA OFFLOAD PROCESSOR

BACKGROUND

The present disclosure relates generally to efficient data processing using integrated circuits. More particularly, the present disclosure relates to offloading certain computations of programmable logic on an integrated circuit (e.g., an FPGA) to an offload processor.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that may serve as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design.

In ICs such as FPGAs, the programmable logic is typically configured using low level programming languages such as VHDL or Verilog. Unfortunately, these low level programming languages may provide a low level of abstraction and, thus, may provide a development barrier for programmable logic designers. Higher level programming languages, such as OpenCL have become useful for enabling more ease in programmable logic design. The higher level programs are used to generate code corresponding to the low level programming languages. Kernels may be useful to bridge the low level programming languages into executable instructions that may be performed by the integrated circuits. Accordingly, OpenCL programs typically utilize at least a single hardware implementation for each kernel in the OpenCL program. Unfortunately, as these programs become more complex and/or sophisticated, the performance of the implementation on the integrated circuit may be negatively impacted. For example, logic storage area on the IC (e.g., FPGA) may oftentimes be a limiting factor for design of the programs. Further, complex functions may be slow or expensive to implement in the IC hardware.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for offloading one or more basic blocks (e.g., a basic code portion of a kernel without any branching) to one or more external central processing units (CPUs) based upon guidance from the designer and/or a compiler of the programmable logic. In particular, the present embodiments may determine particular basic blocks to offload to specific CPUs based, for example, upon the functionality of the basic blocks, the frequency of execution of the basic blocks, and/or the configuration of the CPUs.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for enhancing performance of machine-readable programs implemented on an integrated circuit (IC). In particular, explicit allocation of logical memory to physical memory areas may be used to enhance performance of a machine-implemented program executed on the IC. These modifications may be made based upon performance metrics or other characteristics of the machine-readable program.

Figure 1:
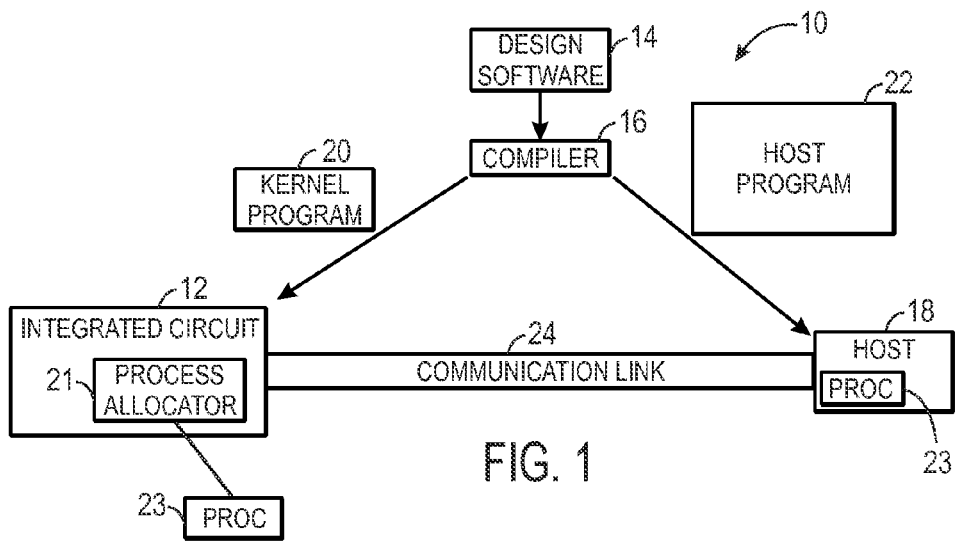
FIG. 1 is a block diagram of a system that utilizes a central processing unit (CPU) to process basic block functionality of a machine-implemented program, in accordance with an embodiment.

With the foregoing in mind, FIG. 1 illustrates a block diagram of a system 10 that utilizes adaptable logic to affect a machine-implemented program. As discussed above, a designer may desire to implement functionality on an integrated circuit 12 (IC, such as a field programmable gate array (FPGA)). The designer may specify a high level program to be implemented, such as an OpenCL program, which may enable the designer to more efficiently and easily provide programming instructions to implement a set of programmable logic for the IC 12 without requiring specific knowledge of low level computer programming languages (e.g., Verilog or VHDL). For example, because OpenCL is quite similar to other high level programming languages, such as C++, designers of programmable logic familiar with such programming languages may have a reduced learning curve than designers that are required to learn unfamiliar low level programming languages to implement new functionalities in the IC.

The designers may implement their high level designs using design software 14, such as a version of Quartus® by Altera. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in programmable logic on the IC 12. As will be discussed in more detail below, the high level designs or programs and/or the low level program may be interpreted and controlled such that particular portions of resultant low level program (e.g., a basic block of the kernel 20) may be offloaded for processing by an external processor (e.g., a processor of the host 18 or any other processor of the system 10). The IC 12 and/or the compiler 16 may include a process allocator 21, which, as will be discussed in more detail below, may redirect one or more processes of the kernel 20 to a processor 23.

The host 18 may receive a host program 22, which may be implemented by the kernel programs 20. To implement the host program 22, the host 18 may communicate instructions from the host program 22 to the IC 12 via a communications link 24. Certain processes implemented via the host program 22 may be executed by the processor(s) 23, which may increase throughput of the system 10 and/or increase an amount of logical space of the IC 12.

Figure 2:
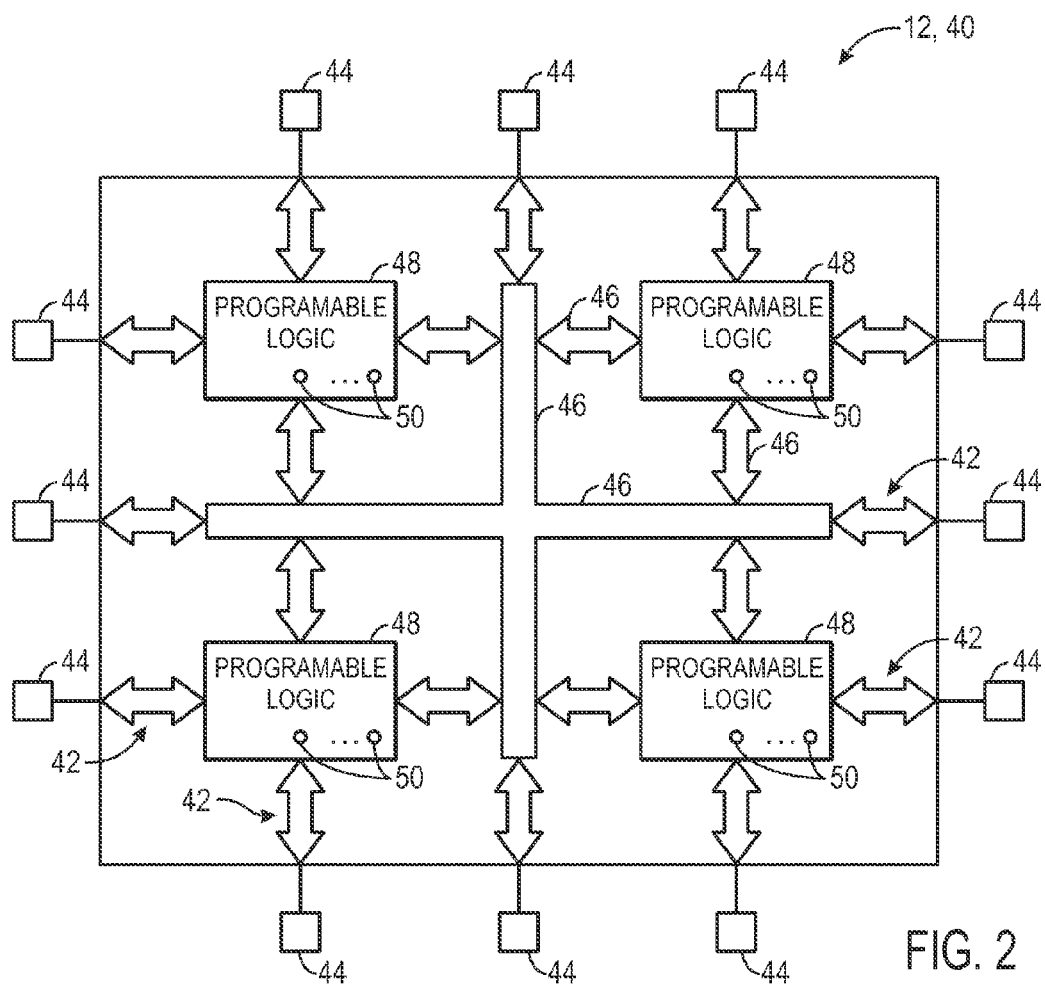
FIG. 2 is a block diagram of a programmable logic device that may offload computation to a CPU, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of integrated circuit device with programmable logic (e.g., an application-specific integrated circuit (ASIC), and application-specific standard product (ASSP), or a programmable logic device (PLD)). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include process allocation logic (e.g., process allocator 21 of FIG. 1), such that the certain custom logic functions of the programmable logic 48 may be offloaded to a separate processor for computation (e.g., based upon a programmable logic designer's allocation request and/or a compiler request). For example, in some embodiments, a specialized processor (e.g., a processor configured with floating point operations) may more efficiently process certain functions (e.g., floating point operations, such as Sine or Cosine functions). Accordingly, in certain situations, offloading these functions may increase system throughput, despite associated latency in the transmission of the computation to the separate processor. Further, in certain embodiments where the area of programmable logic 48 is limited or may become limited, rarely utilized functions may be offloaded to the separate processor, such that programmable logic 48 may be reserved or freed up for more heavily utilized functions.

Programmable logic devices (PLDs), such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

As discussed above, the FPGA 40 may allow a designer to create a customized design capable of executing and performing customized functionalities. Each design may have its own hardware implementation to be implemented on the FPGA 40. For instance, a single hardware implementation may be used for each kernel in a design for the FPGA 40. In some instances, it may be desirable to enhance performance of the program by allowing the compiler 16 and/or programmable logic designer to explicitly allocate certain functions of programmable logic 48 to be executed by a processor external to the programmable logic 48. Thus, programmable logic 48 may be more reserved and/or throughput may be increased via computing processes on a more efficient processor. This is described in more detail below.

Figure 3:
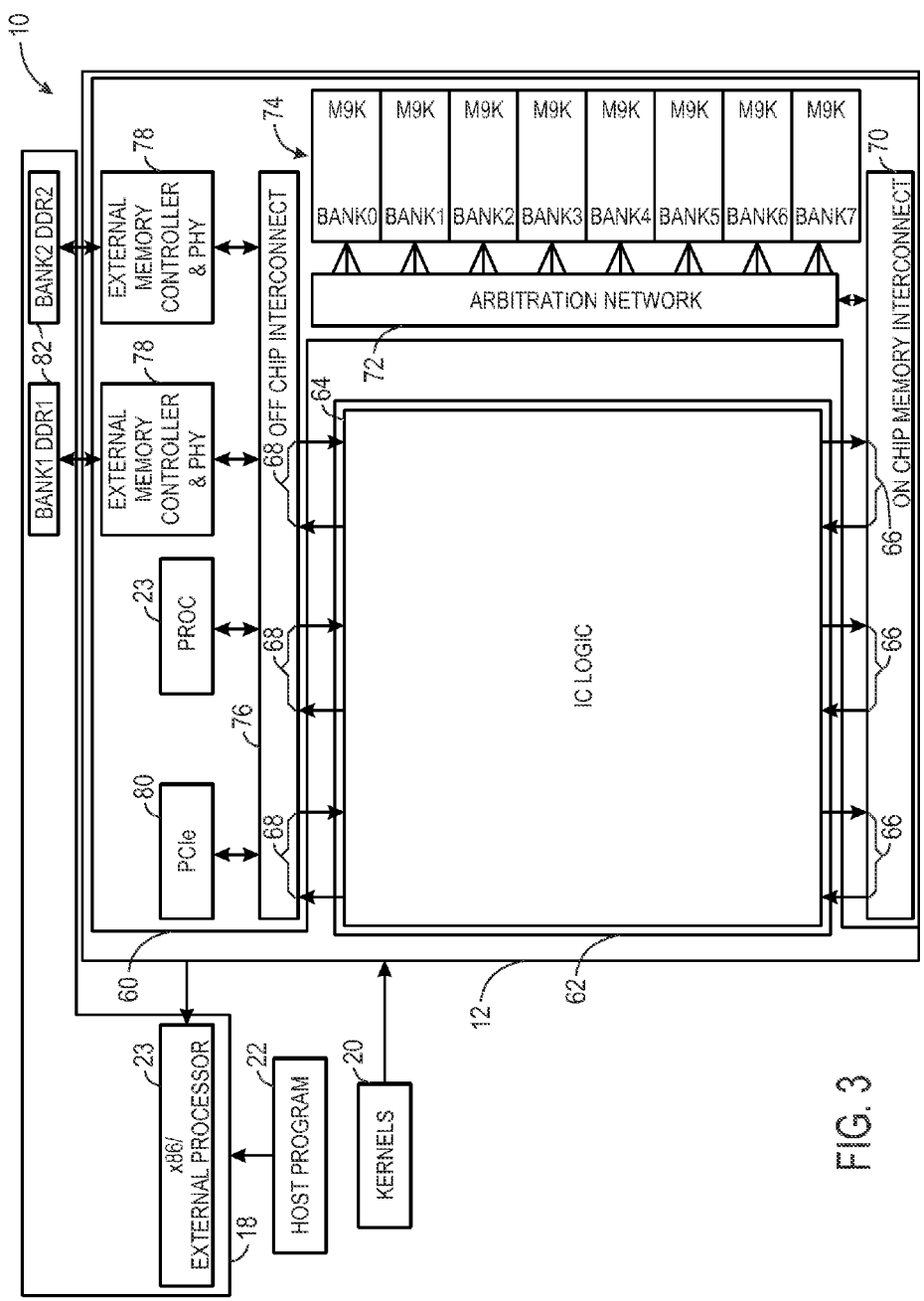
FIG. 3 is a block diagram illustrating elements of the host and integrated circuit of FIG. 1, in accordance with an embodiment.

Referring now to FIG. 3, a block diagram illustrating the system 10, further detailing elements of the host 18 and IC 12 of FIG. 1 is provided. As illustrated, the IC 12 may include fixed components 60 and configurable components 62. For example, in some embodiments, the configurable components may include IC logic blocks 64 stored on an IC 12 (such as FPGA 40 of FIG. 2). The IC logic blocks 64 may provide an ability to add customizable logic to the IC 12. For example, the kernels 20 useful to the host program 22 may be implemented in the IC logic blocks 64, such that the host program may be implemented via the kernels 20. The IC logic blocks 64 may include one or more ports to both on-chip memory interconnects and off-chip interconnects (ports 66 and 68, respectively). The IC logic blocks 64 are not restricted to a particular protocol; however, each of the IC logic blocks 64 within an IC 12 may agree on a common protocol. For example, each of the IC blocks 64 may use the Avalon® Memory-Mapped (Avalon-MM) interface, which may allow easy interconnection between components in the IC 12.

Turning now to a discussion of the fixed logic 60, the fixed logic 60 may include an on-chip memory interconnect 70, an arbitration network 72, local memory 74, an off-chip interconnect 76, external memory and physical layer controllers 78, and/or a PCIe bus 80. The on-chip memory interconnect 70 may connect to the IC logic blocks 64 over the on-chip memory interconnect ports 66 of the IC logic blocks 64. The on-chip memory interconnect 70 may facilitate access between the IC logic blocks 64 and the local memory 74 via the arbitration network 72. Further, the off-chip memory interconnect 76 may connect to the IC logic blocks 64 over the off-chip memory interconnect ports 68 of the IC logic blocks 64. The off-chip interconnect 76 may facilitate communications between the IC logic blocks 64 and the host communications components (e.g., the external memory and physical layer controllers 78 and the PCIe bus 80). The external memory and physical layer controllers 78 may facilitate access between the IC 12 and external memory (e.g., memory 82 of the host 18). Further, the PCIe bus 80 may facilitate communication between the IC 12 and an external processor (e.g., processor 23 of the host 18). As will become more apparent, based on the discussion that follows, coordination of onboard processing and offloaded processing may provide certain efficiencies such as increased throughput and/or efficient onboard IC logic block 64 utilization. As used herein, the term "offload" or "offloaded" processing refers to transferring logical processing from one or more IC logic blocks 64 to a separate processor 23 (e.g., a processor of the IC 12 or a processor external to the IC 12, such as a processor of the host 18 that is not used for processing the IC logic blocks 64 of the IC 12).

Figure 4:
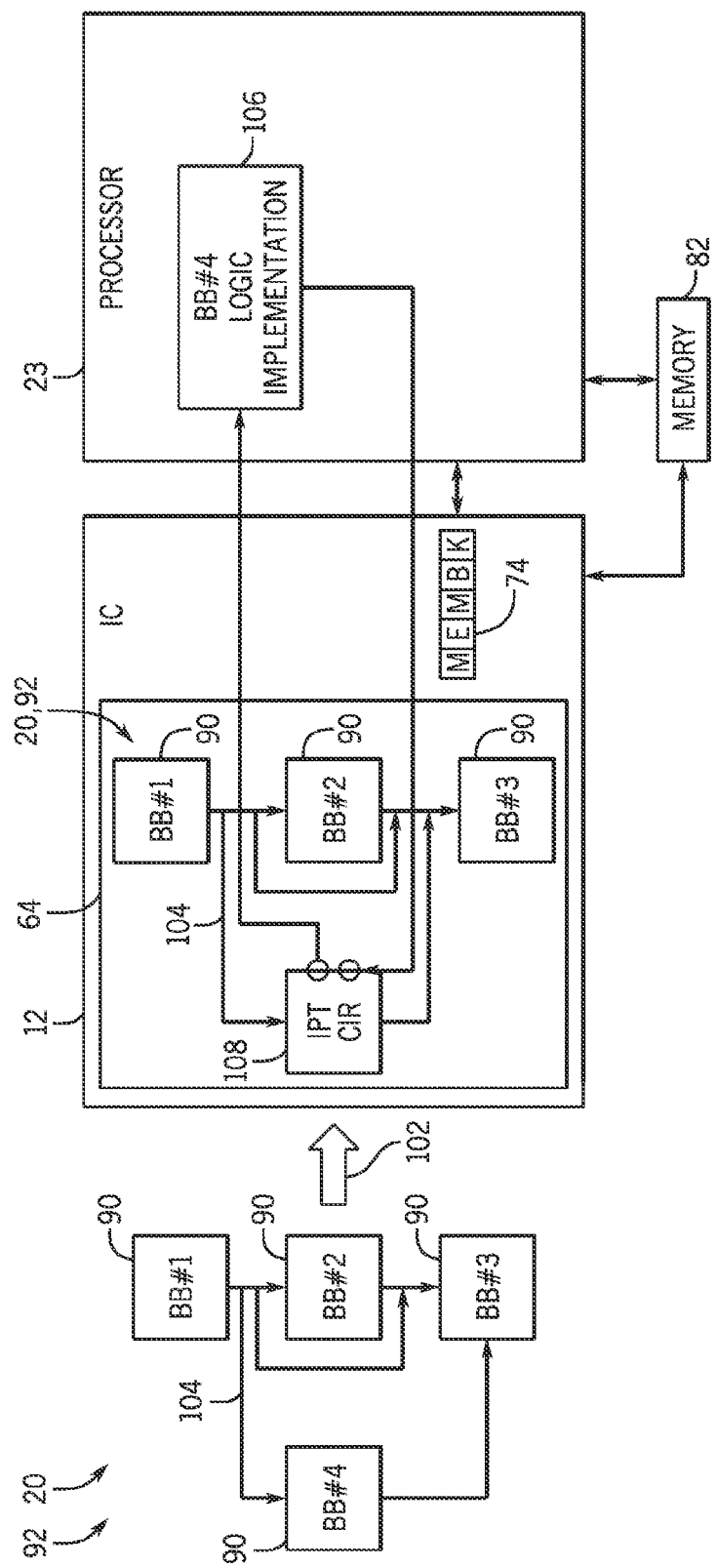
FIG. 4 is an illustration of an example of offloading basic block functionality to a CPU, in accordance with an embodiment.
Figure 5:
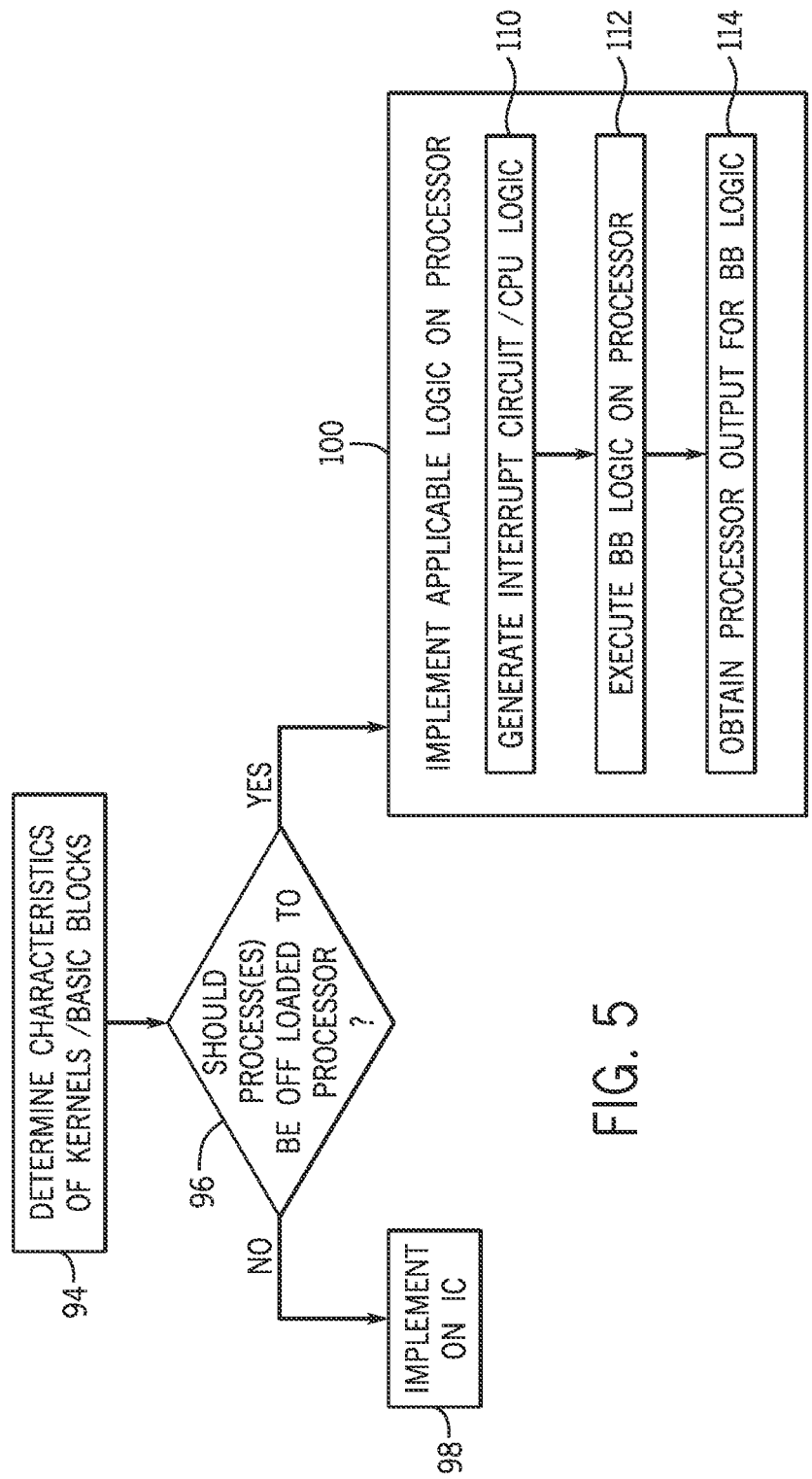
FIG. 5 is a flow chart, illustrating a process for offloading basic block functionality to a CPU, in accordance with an embodiment.

Turning now to a more detailed discussion of offloaded processing, FIG. 4 is an illustration of an example of offloading basic block functionality to a CPU, in accordance with an embodiment. Further, FIG. 5 is a flow chart, illustrating a process for offloading basic block functionality to a CPU, in accordance with an embodiment. For simplicity, FIGS. 4 and 5 will be discussed concurrently. As previously mentioned, the kernels 20 may be decomposed into a sequence of basic blocks 90. Each basic block 90 represents a straight line portion of code from the kernel 20 that does not have any branching. The control graph 92 of FIG. 4 illustrates a composition of basic blocks 90 making up a kernel 20.

To offload certain processes to an offload processor 23, it may be beneficial to analyze the basic blocks 90 and/or the overall kernel 20 to determine particular characteristics of the basic blocks 90 and/or kernel 20 (block 94 of FIG. 5). For example, hardware-implemented machine-readable instructions (e.g., compiler 16) may discern an expected frequency of use of the basic block 90 and/or kernel 20, an expected complexity of implementation of the basic blocks 90 and/or kernel 20, an expected amount of programmable logic area needed to implement the basic blocks 90 and/or kernel 20, etc. The frequency of use of the basic block 90 and/or kernel 20 may be obtained via branch probability analysis of the control flow graph 92. For example, static heuristic based techniques and/or profile directed techniques may be used.

Based on these characteristics and/or other characteristics related to offloading computations, such as: transmission latency, expected processor 23 computation time, total throughput of the system 10, and/or designer-specified allocation, the machine-readable instructions and/or the programmable logic design may determine whether any particular basic blocks 90 and/or kernels 20 should be offloaded to a processor (decision block 96). In some embodiments, throughput efficiency and/or IC 12 programmable logic area efficiency tradeoffs may be specified in the design software 14, which may affect the determination made at decision block 96. Further, in some embodiments, the designer using the design software 14 may explicitly indicate that particular functionality should be offloaded generally to a processor 23 or specifically to a particular processor 23. If the basic blocks 90 and/or kernels 20 should not be offloaded, they are implemented on the IC 12 (block 98). Otherwise, if particular basic blocks 90 and/or kernels 20 should be offloaded to the offload processor 23, these basic blocks 90 and/or kernels 20 are implemented as machine-readable code for execution on the offload processor 23 (block 100).

In FIG. 4, during implementation 102 of the kernel 20 on the IC 12 and/or offload processor 23, it is determined that processing of Basic Block #4 should be offloaded to the offload processor 23. For example, during the characteristic analysis step of block 94, it may be determined that Basic Block #4 will be infrequently executed (e.g., because conditions for using the execution path 104 rarely occur). During the determination step of decision block 96, it may be discerned that Basic Block #4 should be offloaded because Basic Block #4 is infrequently executed and offloading would result in efficient programmable logic area utilization. Accordingly, Basic Block #4 logic 106 is implemented on the processor 23 (block 98). In one embodiment, to implement the logic on the processor #23, the hardware-implemented instructions may generate an interrupt circuit 108 or interrupt logic in the programmable logic blocks 64 of the IC 12 and/or may generate logic to be run on the processor 23 corresponding to the function of the logic to be offloaded (Basic Block #4 logic 106) (block 110). In some embodiments, the interrupt logic may be implemented by a notification mechanism other than a hardware-based interrupt. For example, the interrupt logic may be implemented via memory value polling. Additional, in some embodiments, the generated processor logic may be stored in a dynamic link library (DLL) with other generated processor logic, such that the logic may be accessed by the processor 23.

The interrupt circuit 108 may be used to call the offloaded function with the proper input data. For example, in the provided embodiment, when the executed host program requests that the functionality of Basic Block #4 be executed, the interrupt circuit 108 may provide a function name and arguments representative of the Basic Block #4 logic 106 accessible by the processor 23 (e.g., via a DLL). Upon execution of the interrupt circuitry 108, the processor 23 may execute the Basic Block #4 logic 106 with the arguments (e.g., inputs) provided by the interrupt circuit 108 (block 112). The interrupt circuit may also specify a memory location (e.g., memory 82 or 74 of FIG. 3) where resultant computations may be stored. Upon completing the computations, the processor 23 may store the resultant data in the memory location (e.g., memory 82 or 74) specified by the interrupt circuit 108. After the data is stored by the processor 23, the interrupt circuit 108 may obtain the data and continue execution of the kernel 20 (block 114).

As may be appreciated, there may be transmission latency or other delay resulting from offloading computations. Accordingly, the interrupt circuit 108 may include stall functionality that stalls the execution pipeline until a result is obtained by the IC 12 (e.g., block 114 is completed). Accordingly, in the example of FIG. 4, the interrupt circuit 108 may cause the stall of further execution (e.g., providing input to Basic Block #3, etc.) until the interrupt circuit 108 receives the results of the Basic Block #4 logic 106 from the processor 23. Upon receiving the output from the processor 23, the kernel execution may continue, where Basic Block #3 consumes the processor 23 resultant data obtained by the interrupt circuit 108.

Figure 6:
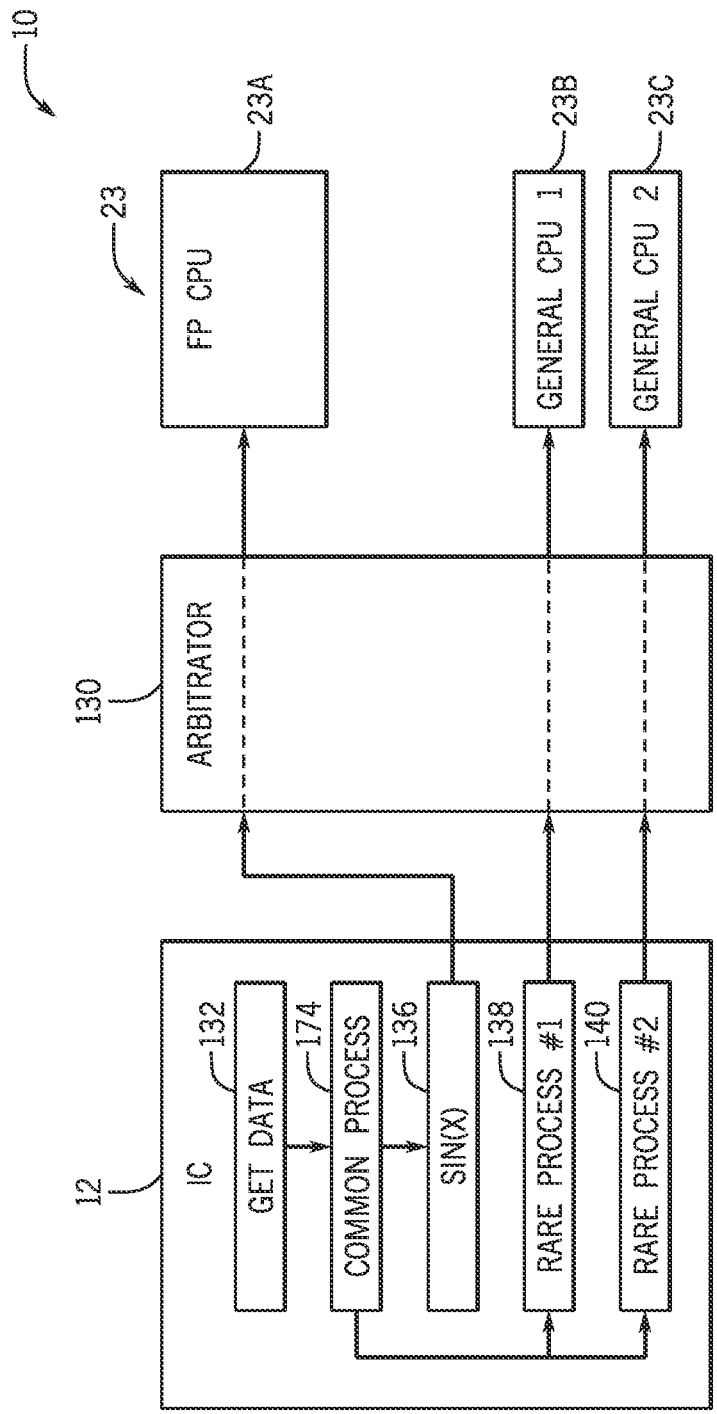
FIG. 6 is a block diagram of an offloaded computation system, in accordance with an embodiment.

Multiple processors 23 may be used in a system 10 with process offloading. FIG. 6 is a block diagram of a multi-processor system with process offloading, in accordance with an embodiment. In some embodiments, one or more of the processors may be specialized function processors and/or one or more of the processors may be general purpose processors. In the system 10 of FIG. 6, three processors 23 are capable of executing offloaded processes. Floating Point Processor 23A may be a specialized function processor that may efficiently process floating point logic. Processors 2 and 3, 23B and 23C, respectively, may be general purpose processors capable of interpreting and implementing machine-readable instructions.

As mentioned above, certain processes (e.g., basic blocks and/or kernels) may be offloaded for execution by one or more of the processors 23. For example, processes that are not easily implemented on the IC 12 may be offloaded, processes that would utilize a significant area of the IC 12 relative to other processes may be offloaded, and/or relatively rare processes may be offloaded. To handle guidance of these processes to particular processors in a multi-processor system, an arbitrator 130 may be included in the system. The arbitrator 130 may control which processor executes and returns computation results for a particular piece of offloaded functionality. In some embodiments, the arbitrator may be machine-readable instructions and/or hardware executed on the host program 22, while in some embodiments, the arbitrator 130 may be machine-readable instructions and/or hardware of the IC 12 and/or compiler 16. If the provided embodiment, the IC 12, includes five functional portions including: a Get Data function 132, a Common Process function 134, a Sine function 136, a Rare Process #1 function 138, and a Rare Process #2 function 140. Based upon specified criteria, the compiler 16, host 18 and/or IC 12 may determine that the Sine Function 136, Rare Process #1 138, and Rare Process #2 140 should all be offloaded (e.g., because Sine Function 136 is not efficiently implemented on the IC 12 and the Rare Processes #1 and #2 138 and 140 are infrequently executed). These functions may be sent to the arbitrator 130, where they are routed to a particular processor 23. For example, the floating point processor 23A may include logic specific to a Sine function, thus providing eased implementation of the Sine function 136. Accordingly, the arbitrator 130 may provide the Sine function 136 to the floating point processor 23A. Further, Rare Processes #1 and #2 138 and 140 may be implemented with relative ease on general purpose processors 23B and 23C. However, sending both processes 138 and 140 may result in decreased throughput in comparison to sending each process to a separate processor 23. Accordingly, the arbitrator 130 may load-balance the processors 23, such that the offloaded processes may be spread across processors 23 to increase throughput. In the current embodiment, Rare Process #1 138 is executed by General Purpose Processor #1 23B and Rare Process #2 140 is executed by General Purpose Processor #2 23C.

By enabling offloaded allocation of certain computations to separate processors, enhanced programmable logic designs and increased efficiency of those programmable logic designs may result. For example, a programmable logic designer and/or the design software may optimize the programmable logic design for performance by sending particular computations to a processor that may efficiently solve the computation. Further, the programmable logic area of the IC may be more efficiently utilized by prioritizing placement of more frequently used logic onboard over less frequently used logic.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims. Moreover, means-plus-function or step-plus-function construction is not intended unless a claim recites "means for" or "step for" followed by a function. Recitations such as "configured to" are intended to define the operation of claim elements without invoking means-plus-function or step-plus-function construction.

What is claimed is:

1. A method, comprising:
    determining whether one or more basic blocks of a kernel implementable on programmable logic on an integrated circuit is to be implemented on one or more offload processors separate from the programmable logic;
    assigning offload logic corresponding to the one or more basic blocks to the one or more offload processors when the one or more basic blocks is to be implemented on the one or more offload processors; and
    assigning the one or more basic blocks on the programmable logic on the integrated circuit when the one or more basic blocks is not to be implemented on the one or more offload processors.

2. The method of claim 1, comprising receiving an indication from a host program that the one or more basic blocks is to be implemented on the one or more offload processors.

3. The method of claim 1, comprising implementing interrupt logic in the programmable logic on the integrated circuit, wherein the interrupt logic is configured to reference and trigger execution of the offload logic at the one or more offload processors.

4. The method of claim 3, wherein the interrupt logic is implemented by a notification mechanism that is not a hardware interrupt.

5. The method of claim 4, wherein the interrupt logic is implemented by memory value polling.

6. The method of claim 1, comprising receiving an indication from design software of a programmable logic designer's indication that the one or more basic blocks is to be implemented on the one or more offloaded processors.

7. The method of claim 1, comprising determining that the one or more basic blocks is to be offloaded to the one or more offload processors based upon a throughput analysis of the kernel, a programmable logic area analysis of the integrated circuit, an implementation complexity analysis of the kernel, a cost function analysis, or any combination thereof.

8. The method of claim 1, comprising:
    determining a particular processor allocation for the one or more basic blocks, wherein the particular processor allocation comprises a determination of one or more particular offload processors of the one or more offload processors where the one or more basic blocks is to be implemented; and
    assigning the one or more basic blocks to the one or more particular offload processors according to the particular processor allocation by configuring the programmable logic on the integrated circuit, by generating instructions on an offload processor, or a combination thereof.

9. An integrated circuit device comprising:
one or more programmable logic blocks configured to store a kernel comprising one or more basic blocks;
an off-chip interconnect that provides access between one or more offload processors and the integrated circuit; and
interrupt circuitry, configured to route to an implementation of one or more of the programmable logic blocks of the kernel on at least one of the one or more offload processors separate from a programmable logic processor of the integrated circuit.

10. The integrated circuit device of claim 9, wherein the interrupt circuitry is configured to cause implementation of the one or more basic blocks on the at least one of the one or more offload processors based upon an instruction from a host communicatively coupled to the integrated circuit.

11. The integrated circuit device of claim 9, wherein the interrupt circuitry is configured to provide an indication of a processor-interpretable function associated with the one or basic blocks at a time when the one or more basic blocks is to be invoked by a host program.

12. The integrated circuit device of claim 11, wherein the interrupt circuitry is configured to provide an indication of a memory location where a result from the processor-interpretable function is to be stored for subsequent retrieval by the integrated circuit device.

13. The integrated circuit device of claim 12, wherein the integrated circuit device is configured to obtain the result from the memory location after the processor has finished invoking the processor-interpretable function.

14. The integrated circuit device of claim 13, wherein the integrated circuit device is configured to stall execution of a kernel pathway until the result is obtained.

15. The integrated circuit device of claim 9, comprising an arbitrator configured to direct implementation of a function associated with the one or more basic block to one of two or more offload processors based upon an offload processor load balancing technique.

16. The integrated circuit device of claim 9, comprising an arbitrator configured to direct implementation of a function associated with the one or more basic block to one of two or more offload processors based upon an ability of the one of the two or more offload processors to efficiently handle the function in relation to the other of the two or more offload processors.

17. A tangible non-transitory computer-readable medium, comprising instructions to:
determine characteristics of one or more basic blocks of a kernel to be implemented in programmable logic blocks of an integrated circuit;
determine whether or not any of the one or more basic blocks of the kernel is to be offloaded for implementation by one or more offload processors separate from a programmable logic processor of the integrated circuit;
for any of the one or more basic blocks that is to be offloaded, cause implementation of a function associated with the corresponding one or more blocks on at least one of the one or more offload processors; and
for any of the one or more basic blocks that is not to be offloaded, cause implementation of the corresponding one or more blocks in the programmable logic blocks of the integrated circuit.

18. The tangible computer-readable medium of claim 17, wherein the instructions to cause implementation of a function associated with the corresponding one or more blocks on at least one of the one or more offload processors comprises instructions to:
generate a dynamic link library containing the function; and
generate an interrupt circuit in the programmable logic blocks, wherein the interrupt circuit is configured to cause invocation of the function at the at least one of the one or more offload processors.

19. The tangible computer-readable medium of claim 17, comprising instructions to determine whether or not any of the one or more basic blocks of the kernel is to be offloaded based upon a throughput versus programmable logic area tradeoff.

20. The tangible computer-readable medium of claim 17, comprising instructions to determine whether or not any of the one or more basic blocks of the kernel is to be offloaded based upon a frequency that the one or more basic blocks will be invoked.

* * * * *